US012066659B2

United States Patent
Chang et al.

(10) Patent No.: US 12,066,659 B2
(45) Date of Patent: Aug. 20, 2024

(54) PROTECTIVE RING STRUCTURE TO INCREASE WAVEGUIDE PERFORMANCE

(71) Applicant: Taiwan Semiconductor Manufacturing Company, Ltd., Hsin-Chu (TW)

(72) Inventors: Yung-Chang Chang, Taipei (TW); Meng-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/324,212

(22) Filed: May 26, 2023

(65) Prior Publication Data
US 2023/0296839 A1    Sep. 21, 2023

Related U.S. Application Data

(60) Continuation of application No. 17/735,383, filed on May 3, 2022, now Pat. No. 11,703,642, which is a division of application No. 16/806,043, filed on Mar. 2, 2020, now Pat. No. 11,333,827.

(51) Int. Cl.
*G02B 6/124* (2006.01)
*G02B 6/136* (2006.01)
*H01L 23/48* (2006.01)
*G02B 6/12* (2006.01)

(52) U.S. Cl.
CPC ............. *G02B 6/124* (2013.01); *G02B 6/136* (2013.01); *H01L 23/48* (2013.01); *G02B 6/12002* (2013.01); *G02B 6/12004* (2013.01); *G02B 6/12019* (2013.01)

(58) Field of Classification Search
None
See application file for complete search history.

(56) References Cited

U.S. PATENT DOCUMENTS

| | | |
|---|---|---|
| 9,915,784 B2 | 3/2018 | Budd et al. |
| 10,509,169 B2 | 12/2019 | Chang et al. |
| 2013/0015546 A1 | 1/2013 | Joe et al. |
| 2015/0285998 A1 | 10/2015 | Babakhani et al. |
| 2016/0306110 A1 | 10/2016 | Lambert |
| 2017/0031094 A1 | 2/2017 | Nakashiba et al. |
| 2018/0314003 A1 | 11/2018 | Coolbaugh et al. |
| 2019/0129098 A1* | 5/2019 | Chang .................... G02B 6/124 |
| 2019/0369329 A1 | 12/2019 | Huang et al. |

(Continued)

OTHER PUBLICATIONS

Li et al. "CMOS-compatible high efficiency double-etched apodized waveguide grating coupler" Optics Express vol. 21, No. 7, published on Mar. 25, 2013.

(Continued)

*Primary Examiner* — Jerry Rahll
(74) *Attorney, Agent, or Firm* — Eschweiler & Potashnik, LLC

(57) ABSTRACT

Various embodiments of the present disclosure are directed towards an integrated chip including an optical device disposed on a substrate. A dielectric structure overlies the substrate. The dielectric structure comprises one or more sidewalls defining a light channel over a region of the optical device. A protective structure is above the optical device and disposed on opposing sides of the light channel.

20 Claims, 11 Drawing Sheets

(56) References Cited

U.S. PATENT DOCUMENTS

2020/0310027 A1   10/2020   Boeuf et al.
2021/0271023 A1    9/2021   Chang et al.
2021/0302654 A1    9/2021   Chen et al.

OTHER PUBLICATIONS

Non-Final Office Action dated Oct. 12, 2021 for U.S. Appl. No. 16/806,043.
Notice of Allowance dated Jan. 20, 2022 for U.S. Appl. No. 16/806,043.
Notice of Allowance dated Mar. 2, 2023 for U.S. Appl. No. 17/735,383.

* cited by examiner

PROTECTIVE RING STRUCTURE TO INCREASE WAVEGUIDE PERFORMANCE

REFERENCE TO RELATED APPLICATIONS

This Application is a Continuation of U.S. application Ser. No. 17/735,383, filed on May 3, 2022, which is a Divisional of U.S. application Ser. No. 16/806,043, filed on Mar. 2, 2020 (now U.S. Pat. No. 11,333,827, issued on May 17, 2022). The contents of the above-referenced Patent Applications are hereby incorporated by reference in their entirety.

BACKGROUND

Integrated optical waveguides are often used as components in integrated optical circuits, which integrate multiple photonic functions. Integrated optical waveguides are used to confine and guide light from a first point on an integrated chip (IC) to a second point on the IC with minimal attenuation. Generally, integrated optical waveguides provide functionality for signals imposed on optical wavelengths in the visible spectrum (e.g., between approximately 850 nm and approximately 1650 nm).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
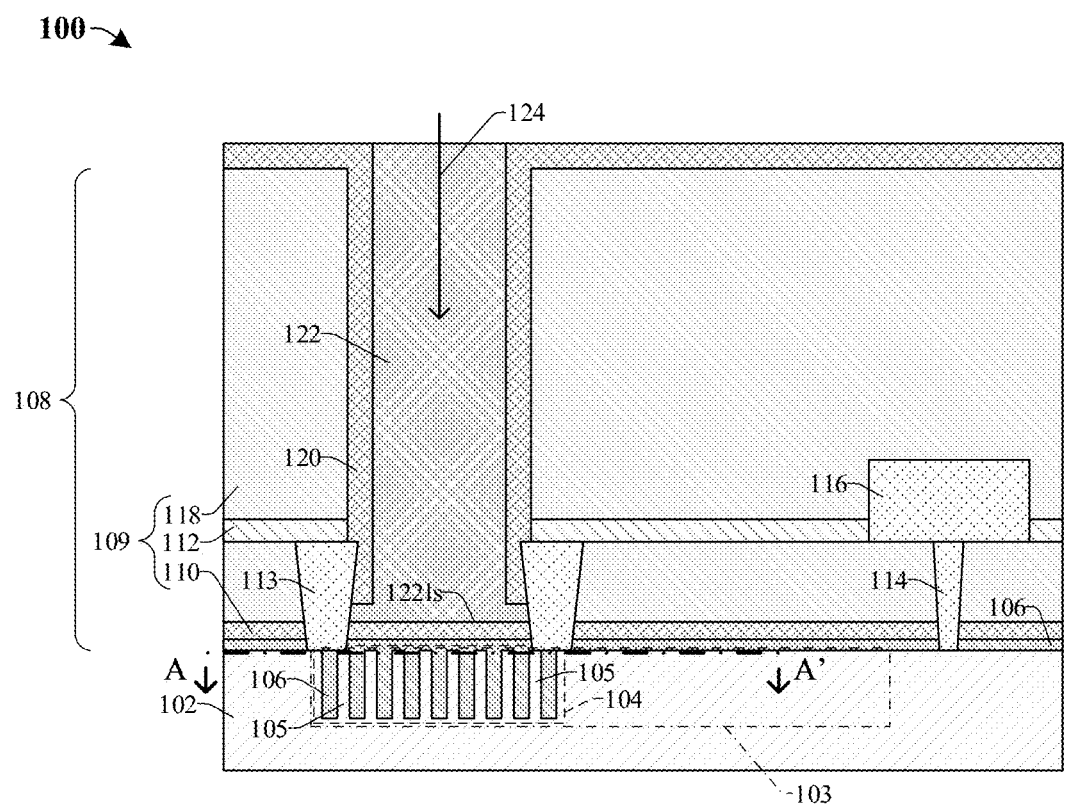
FIG. 1 illustrates a cross-sectional view of some embodiments of an integrated chip comprising a waveguide structure and a protective ring structure overlying the waveguide structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated optical waveguides are often used in integrated circuits. Generally, the integrated optical waveguide is disposed within a semiconductor substrate and includes a grating coupler structure laterally adjacent to an elongated waveguide segment. An interconnect structure overlies the semiconductor substrate and includes alternating stacks of wiring layers (e.g., horizontal routing) and via layers (e.g., vertical routing) disposed within an interconnect dielectric structure. A light pipe structure extends through the interconnect dielectric structure and overlies the grating coupler structure. The light pipe structure is configured to direct incident light to the grating coupler structure. Further, the grating coupler structure is configured to guide or direct the incident light to the elongated waveguide segment. The elongated waveguide segment may carry the incident light to another waveguide or to other semiconductor devices (e.g., by way of the interconnect structure).

Accordingly, in some embodiments, a process for forming an integrated circuit with an integrated optical waveguide includes forming the integrated optical waveguide in a front-side of a semiconductor substrate. An interconnect structure is then formed over the integrated optical waveguide, in which the interconnect structure includes a contact etch stop layer (CESL) over the front-side of the semiconductor substrate. An etch process is performed on the interconnect dielectric structure of the interconnect structure to form a light pipe opening over the grating coupler structure of the integrated optical waveguide. However, the etch process may, for example, be performed by a plasma etch with a high power and a long duration, such that it may be difficult to control a height of the light pipe opening. For example, the long duration of the etch process may result in over-etching into the grating coupler structure. This in turn may render the integrated optical waveguide inoperable and/or lower a sensitivity or quantum efficiency (QE) of the integrated optical waveguide.

In another example, in order to prevent damage to the integrated optical waveguide, a duration of the etch process may be reduced, such that at least a portion of dielectric material overlying the CESL remains after the etch process. Thus, light may be reflected away by the dielectric material overlying the CESL, thereby lowering a QE of the integrated optical waveguide. In yet another example, the light pipe opening may not be filled with a light pipe structure, such that incident light travels through air in the light pipe opening towards the grating coupler structure. In such an example, corrosive chemicals (e.g., water) and/or corrosive materials may interact with sidewalls and/or an upper surface of the interconnect dielectric structure that define the light pipe opening. This in turn may result in delamination of layers within the interconnect structure and/or a widening of the light pipe opening, thereby reducing incident light disposed upon the grating coupler structure and/or further reducing a QE of the integrated optical waveguide.

Various embodiments of the present application are directed towards an integrated chip including a protective ring structure overlying a grating coupler structure. The protective ring structure is configured to facilitate a method for forming the light pipe structure that increases the QE of the integrated optical waveguide and/or prevents damage to the grating coupler structure. In some embodiments, the method includes forming a lower interconnect portion of an interconnect structure over an integrated optical waveguide. The lower interconnect portion includes a contact etch stop layer (CESL), a lower dielectric layer, and a plurality of conductive contacts. Further, during and/or after formation of the lower interconnect portion, a protective ring structure is formed over the grating coupler structure, in which the grating coupler structure is laterally spaced between a perimeter of the protective ring structure. An upper interconnect portion of the interconnect structure is formed over the protective ring structure and the lower interconnect portion. A first etch process (e.g., a dry etch process) is performed on the interconnect structure, thereby forming a light pipe opening over the grating coupler structure. The first etch process is performed until the lower dielectric layer is reached, such that at least a portion of the lower dielectric layer remains over the CESL after the first etch process. An upper etch stop layer is formed along sidewalls of the interconnect structure that define the light pipe opening. A second etch process (e.g., a dry etch process) is performed on the upper etch stop layer to expose the portion of the lower dielectric layer remaining over the CESL. A third etch process (e.g., a wet etch process) is performed to remove the portion of the lower dielectric layer remaining over the CESL, thereby exposing an upper surface of the CESL and expanding the light pipe opening. The protective ring structure is configured to prevent the third etch process from damaging and/or removing the lower dielectric layer in regions that are laterally offset from the grating coupler structure. Further, a light pipe structure may be formed in the light pipe opening. Disposing the protective ring structure over the grating coupler structure mitigates damage to the integrated optical waveguide and/or facilities formation of a light pipe opening and/or light pipe structure with an accurate height. This in turn increases a performance and/or QE of the integrated optical waveguide.

FIG. 1 illustrates a cross-sectional view of some embodiments of an integrated chip 100 including a waveguide structure 103 and a protective ring structure 113 overlying the waveguide structure 103.

The integrated chip 100 includes an interconnect structure 108 overlying a semiconductor substrate 102. In some embodiments, the semiconductor substrate 102 may, for example, be a bulk substrate (e.g., a bulk silicon substrate), a silicon-on-insulator (SOI) substrate, or some other suitable substrate. In further embodiments, the semiconductor substrate 102 may comprise three layers (e.g., silicon overlying an oxide and silicon underlying the oxide), such that a topmost layer in the three layers is epitaxial silicon. It will be appreciated that other suitable materials for the semiconductor substrate 102 and/or the three layers are also within the scope of the disclosure. In some embodiments, the waveguide structure 103 is disposed within the semiconductor substrate 102. The waveguide structure 103 includes, in part, a grating coupler structure 104. The grating coupler structure 104 may comprise one or more grating segments 105 that are laterally separated from one another by a dielectric waveguide layer 106. The grating coupler structure 104 is configured to receive incident light 124 and direct or guide the incident light 124 to another waveguide structure (not shown) or to another semiconductor device (not shown).

The interconnect structure 108 overlies the semiconductor substrate 102 and includes an interconnect dielectric structure 109, conductive via(s) (e.g., a conductive contact 114), conductive wire(s) (e.g., a conductive wire 116). In some embodiments, the protective ring structure 113 may comprise a same material (e.g., aluminum, copper, tungsten, another suitable conductive material, or any combination of the foregoing) as the conductive contact 114 and/or the conductive wire 116. The interconnect dielectric structure 109 includes a contact etch stop layer (CESL) 110, an inter-level dielectric (ILD) structure 118, and a conductor protection layer 112. The conductive contact 114 extends from the conductive wire 116 to a doped region (not shown) of the semiconductor substrate 102 and/or a semiconductor device (e.g., a transistor) (not shown). An upper etch stop layer 120 extends across an upper surface of the interconnect structure 108, through the interconnect dielectric structure 109, to a point below the conductor protection layer 112. In some embodiments, the upper etch stop layer 120 extends over an upper surface and a sidewall of the protective ring structure 113. In some embodiments, the protective ring structure 113 is electrically isolated from other conductive layers and/or features disposed within the interconnect structure 108. A light pipe structure 122 extends along an inner sidewall of the upper etch stop layer 120 to an upper surface of the CESL 110. The light pipe structure 122 is configured to direct the incident light 124 to the waveguide structure 103. In some embodiments, the light pipe structure 122 may, for example, be or comprise a high-k dielectric material, a material with a high refractive index (e.g., the refractive index is within a range of about 1.5 to 2.2, or greater than about 2, etc.), an organic material (with a refractive index of about 1.5 to 2.2), air, another suitable material, or any combination of the foregoing. In some embodiments, the light pipe structure 122 may be or comprise air, such that the light pipe structure 122 is omitted (not shown) and an opening extends from an upper surface of the upper etch stop layer 120 to the upper surface of the CESL 110 in place of the light pipe structure 122.

In some embodiments, by disposing the protective ring structure 113 over the grating coupler structure 104, a location of a lower surface 122*ls* of the light pipe structure 122 may be more easily controlled while preventing damage to the grating coupler structure 104. For example, during fabrication of the integrated chip 100 one or more dry etch processes may be performed, thereby forming a light pipe opening over the grating coupler structure 104. A wet etch process may be performed after the one or more dry etch processes to expand the light pipe opening by exposing an upper surface of the CESL 110 overlying the grating coupler structure 104. In such embodiments, the protective ring structure 113 is configured to prevent removal of and/or damage to the ILD structure 118 laterally offset from the grating coupler structure 104. This in turn increases control of the lower surface 122ls of the light pipe structure 122. Further, the upper etch stop layer 120 is configured to prevent damage to the interconnect dielectric structure 109 during formation of the light pipe opening (e.g., mitigating lateral removal of the ILD structure 118 above the protective ring structure 113 during the wet etch process). Thus, by disposing the protective ring structure 113 over the grating coupler structure 104, a sensitivity, a structural integrity, and/or a quantum efficiency (QE) of the waveguide structure 103 may be increased.

Figure 2A:
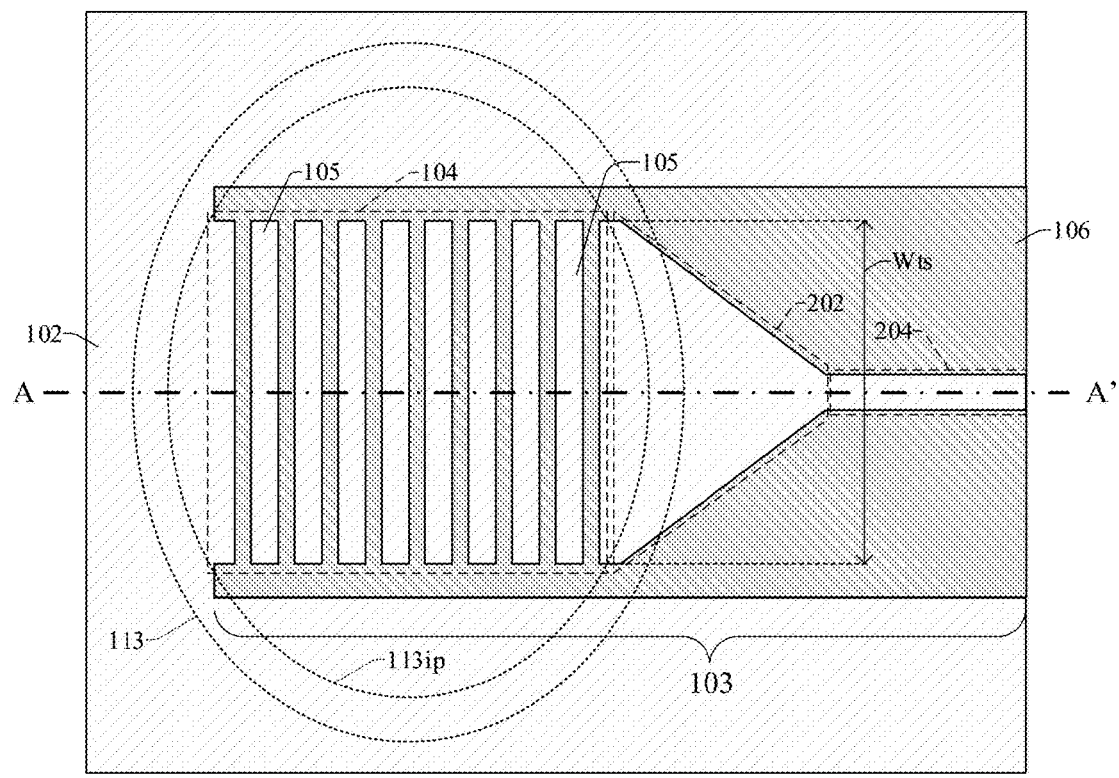
FIGS. 2A and 2B illustrate top views of various embodiments of the integrated chip of FIG. 1 according to the line A-A'.

FIG. 2A illustrates a top view 200a of some embodiments of the integrated chip 100 of FIG. 1 taken along the line A-A'.

In some embodiments, the waveguide structure 103 includes a grating coupler structure 104, a tapered waveguide segment 202, and/or an elongated waveguide segment 204. The grating coupler structure 104 includes one or more grating segments 105 laterally separated from one another by the dielectric waveguide layer 106. The tapered waveguide segment 202 is laterally adjacent to the grating coupler structure 104 and the elongated waveguide segment 204 extends laterally from the tapered waveguide segment 202 in a direction away from the grating coupler structure 104. In some embodiments, the tapered waveguide segment 202 has a width Wts of about 0.5 micrometers, or within a range of about 0.1 to 0.9 micrometers. It will be appreciated that other values for the width Wts are also within the scope of the disclosure. In some embodiments, the one or more grating segments 105 when viewed from above may, for example, be rectangular segments, curved as elliptical, parabolic or circular arc segments. It will be appreciated that other shapes and/or or structures for the grating segments 105 are within the scope of the disclosure. In some embodiments, the one or more grating segments 105 may be separated by trenches (not shown), such that the dielectric waveguide layer 106 is omitted (not shown). In some embodiments, when incident radiation (e.g., 124 of FIG. 1) is disposed upon the grating coupler structure 104, the grating coupler structure 104 directs and/or guides the incident radiation to the tapered waveguide segment 202, the tapered waveguide segment 202 directs and/or guides the incident radiation to the elongated waveguide segment 204. In such embodiments, the elongated waveguide segment 204 is configured to direct and/or guide the incident radiation to another waveguide structure (not shown) or another semiconductor device (not shown). In further embodiments, a conductive contact (not shown) (e.g., the conductive contact 114 of FIG. 1) contacts the elongated waveguide segment 204 and carries the incident radiation to the semiconductor devices. In some embodiments, as illustrated in FIG. 2A, the one or more grating segments 105 are laterally spaced within an inner perimeter 113ip of the protective ring structure 113.

Figure 2B:
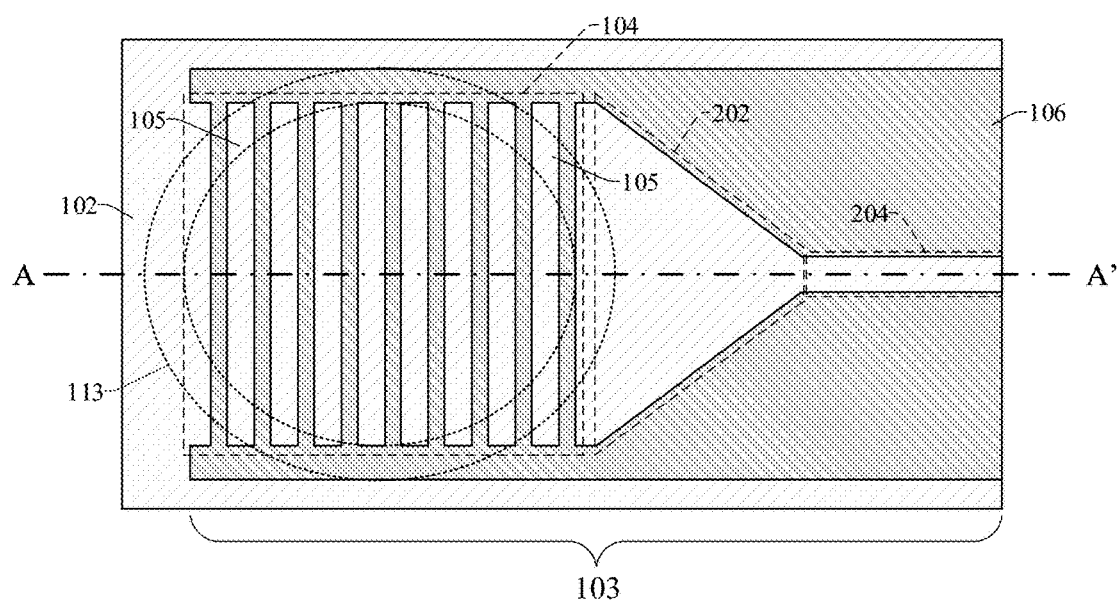

FIG. 2B illustrates a top view 200b according to some alternative embodiments of the integrated chip 100 of FIG. 1 taken along the line A-A'.

As illustrated in the top view 200b of FIG. 2B, an outer perimeter of the protective ring structure 113 may overlie at least a portion of the one or more grating segments 105 of the grating coupler structure 104.

Figure 3:
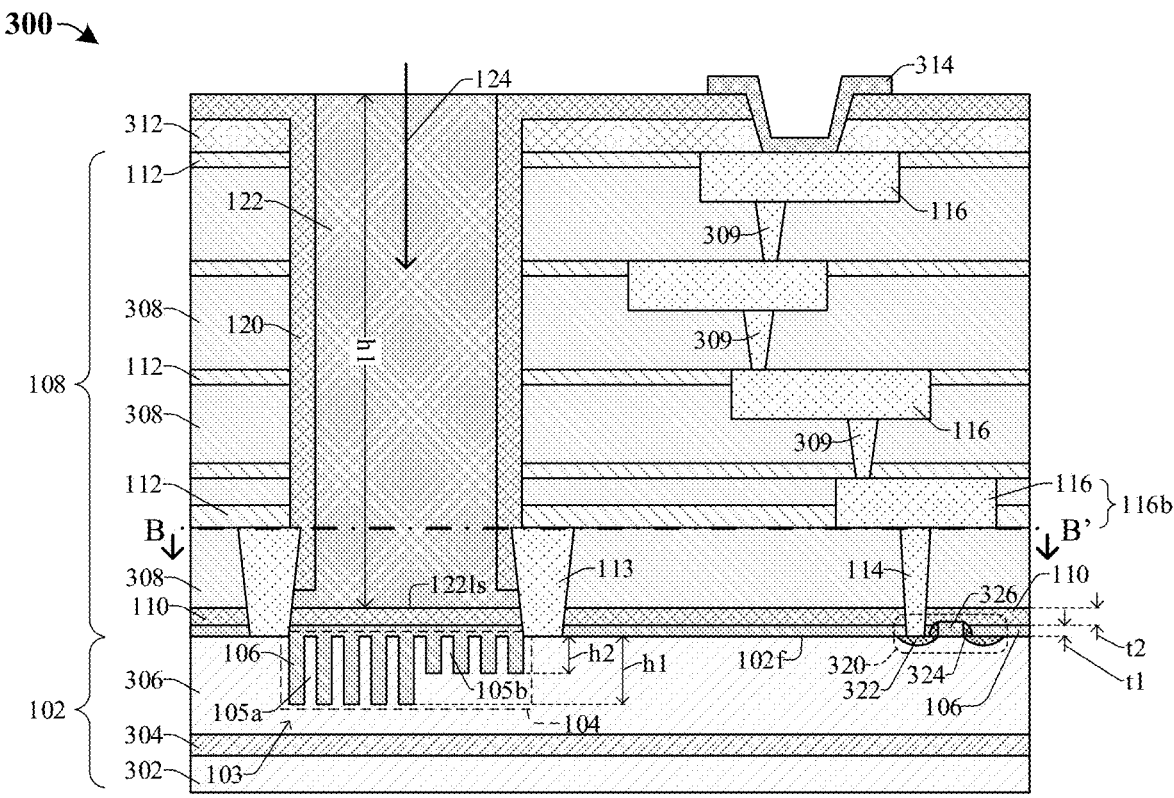
FIG. 3 illustrates a cross-sectional view of some embodiments of an integrated chip comprising a waveguide structure disposed within and/or on a front-side of a semiconductor substrate and one or more semiconductor devices disposed within and/or on the front-side of the semiconductor substrate

FIG. 3 illustrates a cross-sectional view of some embodiments of an integrated chip 300 including a waveguide structure 103 disposed within and/or on a front-side 102f of a semiconductor substrate 102 and one or more semiconductor devices 320 disposed within and/or on the front-side 102f of the semiconductor substrate 102.

The integrated chip 300 includes an interconnect structure 108 overlying the front-side 102f of the semiconductor substrate 102. In some embodiments, the semiconductor substrate 102 may, for example, be a bulk substrate (e.g., a bulk silicon substrate), a silicon-on-insulator (SOI) substrate, or some other suitable substrate. In further embodiments, the semiconductor substrate 102 is configured as an SOI substrate comprising a device layer 306, a handle substrate 302, and an insulator layer 304 disposed between the device layer 306 and the handle substrate 302. In some embodiments, the handle substrate 302 may, for example, be or comprise bulk silicon, silicon, monocrystalline silicon, another suitable material, or any combination of the foregoing. In some embodiments, the device layer 306 may, for example, be or comprise silicon, monocrystalline silicon, another suitable material, or any combination of the foregoing. In further embodiments, the insulator layer 304 may, for example, be or comprise an oxide, such as silicon dioxide, another suitable dielectric material, or any combination of the foregoing. In some embodiments, the waveguide structure 103 is disposed within the device layer 306 of the semiconductor substrate 102 and overlies the insulator layer 304. In further embodiments, the waveguide structure 103 may be configured as the waveguide structure 103 is illustrated and/or described in FIG. 2A or 2B.

The waveguide structure 103 includes a grating coupler structure 104. In some embodiments, the grating coupler structure 104 comprises a first set of grating segments 105a and a second set of grating segments 105b. In some embodiments, the first set of grating segments 105a each have a first height h1 and the second set of grating segments 105b each have a second height h2, where the first height h1 is greater than the second height h2. In some embodiments, the first height h1 may, for example, be within a range of about 1,000 Angstroms to 2,000 Angstroms. It will be appreciated that other values for the first height h1 are also within the scope of the disclosure. In some embodiments, the second height h2 is within a range of about 400 Angstroms to 800 Angstroms. It will be appreciated that other values for the second height h2 are also within the scope of the disclosure. In further embodiments, the first height h1 is at least two times greater than the second height h2. A dielectric waveguide layer 106 may extend along the front-side 102f of the semiconductor substrate 102 and is disposed between the first and second set of grating segments 105a, 105b. In some embodiments, the dielectric waveguide layer 106 may, for example, be or comprise silicon dioxide ($SiO_2$), another suitable dielectric, or any combination of the foregoing. A contact etch stop layer (CESL) 110 overlies the front-side 102f of the semiconductor substrate 102. In some embodiments, the CESL 110 may, for example, be or comprise silicon nitride (e.g., $Si_3N_4$), silicon carbide, another suitable material, or any combination of the foregoing. In some embodiments, a first thickness t1 of the dielectric waveguide layer 106 overlying the front-side 102f of the semiconductor substrate 102 and the grating coupler structure 104 is about 800 Angstroms, within a range of about 750 to 850 Angstroms, or another suitable thickness value. In further embodiments, a second thickness t2 of the CESL 110 overlying the grating coupler structure 104 is about 125 Angstroms, within a range of about 100 to 150 Angstroms, or another suitable thickness.

In some embodiments, one or more semiconductor devices 320 are disposed within and/or on the front-side 102f of the semiconductor substrate 102. In further embodiments, the one or more semiconductor devices 320 may, for example, be configured as transistors, or another suitable semiconductor device. Thus, the one or more semiconductor devices 320 may comprise a gate structure 326, source/drain regions 322 disposed on opposing sides of the gate structure 326, and a sidewall spacer structure 324 disposed along sidewalls of the gate structure 326. The one or more semiconductor devices 320 may be electrically coupled to the interconnect structure 108.

The interconnect structure 108 comprises a plurality of conductor protection layers 112, a plurality of inter-level dielectric (ILD) layers 308, a plurality of conductive contacts 114, a plurality of conductive vias 309, and/or a plurality of conductive wires 116. In some embodiments, a bottommost layer 116b of the conductive wires 116 may directly overlie the conductive contacts 114. The plurality of conductor protection layers 112 may overly a conductive feature in the interconnect structure 108. In some embodiments, the conductor protection layers 112 may, for example, be or comprise silicon carbide, silicon nitride, silicon oxy-nitride, another suitable material, or any combination of the foregoing. In some embodiments, the plurality of ILD layers 308 may, for example, be or comprise silicon dioxide ($SiO_2$), a low-k dielectric material, an extreme low-k dielectric material, another suitable material, or any combination of the foregoing. In some embodiments, the plurality of conductive contacts, vias, and/or wires 114, 309, 116 may, for example, respectively be or comprise aluminum, copper, tungsten, titanium, aluminum copper, another suitable material, or any combination of the foregoing. Further, a passivation structure 312 overlies the interconnect structure 108. A bond pad structure 314 overlies and is electrically coupled to a conductive wire 116 in the interconnect structure 108. In some embodiments, the bond pad structure 314 may, for example, be or comprise aluminum, nickel, gold, another suitable material, or any combination of the foregoing. Further, the bond pad structure 314 may be electrically coupled to another integrated chip (not shown) by way of, for example, a bond wire or another suitable structure.

A protective ring structure 113 is disposed within the interconnect structure 108 and overlies the waveguide structure 103. In some embodiments, an upper surface of the protective ring structure 113 is aligned with an upper surface of the conductive contacts 114 and a lower surface of the protective ring structure 113 is aligned with a lower surface of the conductive contacts 114. In further embodiments, the protective ring structure 113 may, for example, be or comprise a conductive material, such as aluminum, copper, tungsten, titanium, aluminum copper, another suitable material, or any combination of the foregoing. In yet further embodiments, the protective ring structure 113 comprises a same material as the plurality of conductive contacts, vias, and/or wires 114, 309, 116. The protective ring structure 113 may extend below a lower surface of the CESL 110. The grating coupler structure 104 is spaced laterally within a perimeter of the protective ring structure 113. Thus, the protective ring structure 113 is disposed over the grating coupler structure 104 in such a manner as to not impede incident light 124 from reaching the grating coupler structure 104. Further, in some embodiments, the lower surface of the protective ring structure 113 and/or the lower surface of the conductive contacts 114 are disposed below the front-side 102f of the semiconductor substrate 102 (not shown).

In some embodiments, an upper etch stop layer 120 continuously extends from an upper surface of the passivation structure 312, along sidewalls of the ILD layers 308 and/or the conductor protection layers 112, to below the upper surface of the protective ring structure 113. In some embodiments, the upper etch stop layer 120 directly contacts the protective ring structure 113. The upper etch stop layer 120 may, for example, be or comprise silicon nitride ($Si_3N_4$), silicon carbide, silicon oxy-nitride, another suitable material, or any combination of the foregoing. A light pipe structure 122 extends from above the passivation structure 312 to an upper surface of the CESL 110. In some embodiments, a lower surface 122ls of the light pipe structure 122 directly contacts the upper surface of the CESL 110. Further, in some embodiments, a sidewall of the light pipe structure 122 may continuously extend from a sidewall of the upper etch stop layer 120 to a sidewall of the protective ring structure 113. The light pipe structure 122 is configured to guide the light 124 to the grating coupler structure 104.

In some embodiments, during fabrication of the integrated chip 300, the protective ring structure 113 is configured to facilitate removing an ILD layer 308 from the upper surface of the CESL 110. For example, a dry etch process may be performed to create a light pipe opening that extends through the passivation structure 312 and the interconnect structure 108 to a point below the upper surface of the protective ring structure 113, such that a portion of the ILD layer 308 remains over the CESL 110. In such embodiments, a wet etch process is performed to expand the light pipe opening and remove the portion of the ILD layer 308 over the CESL 110, thereby exposing the upper surface of the CESL 110. The wet etch process may, for example, laterally remove segments of the ILD layer 308. Thus, the protective ring structure 113 is configured to prevent lateral removal and/or damage to ILD layers 308 laterally offset from the protective ring structure 113. Further, by performing a dry etch followed by a wet etch, a height h1 of the light pipe structure 122 may be more easily controlled. In some embodiments, the height h1 may, for example, be about 7 micrometers, within a range of about 6 to 8 micrometers, or another suitable value. This in turn increases a QE and/or a structural integrity of the waveguide structure 103. It will be appreciated that other values for the height h1 are within the scope of the disclosure.

Figure 4:
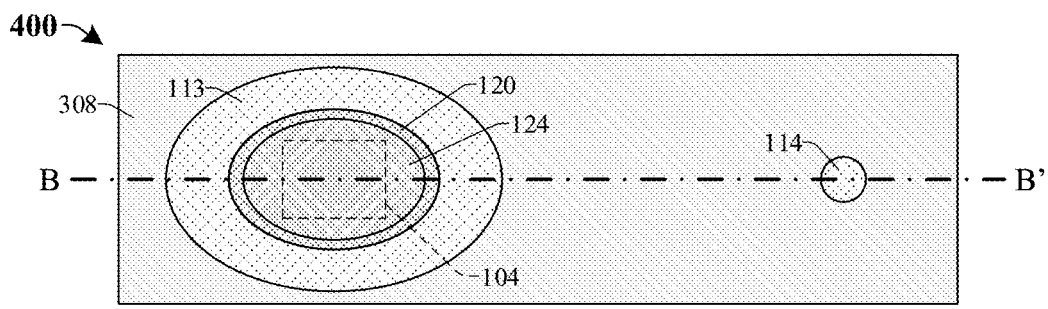
FIGS. 4 and 5 illustrate top views of various embodiments of the integrated chip of FIG. 3 according to the line B-B'.

FIG. 4 illustrates a top view 400 of some embodiments of the integrated chip 300 of FIG. 3 taken along the line B-B'.

In some embodiments, the protective ring structure 113 has a circular/elliptical shape and continuously laterally encloses the grating coupler structure 104. It will be appreciated that other shapes and/or or structures for the protective ring structure 113 are within the scope of the disclosure. Further, the light pipe structure 122 may, for example, have a circular/elliptical shape. It will be appreciated that other shapes and/or structures for the light pipe structure 122 are within the scope of the disclosure. In yet further embodiments, the protective ring structure 113 and/or the light pipe structure 122 are concentric with one another.

Figure 5:
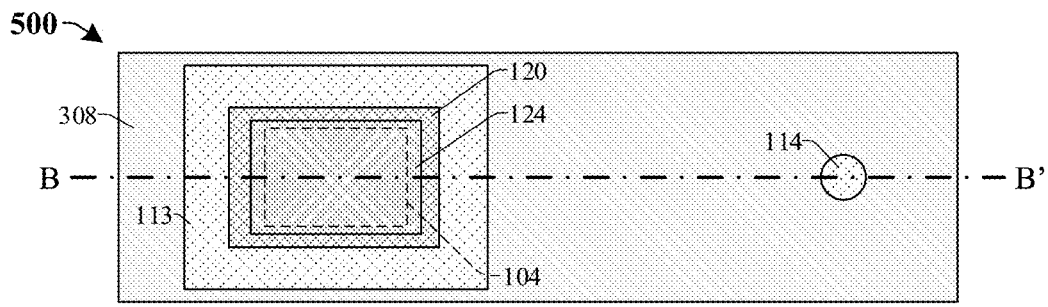

FIG. 5 illustrates a top view 500 of some embodiments of the integrated chip 300 of FIG. 3 taken along the line B-B'.

In some embodiments, the protective ring structure 113 has a rectangular shape and continuously laterally encloses the grating coupler structure 104. Further, the light pipe structure 122 may, for example, have a rectangular shape.

Figure 6A:
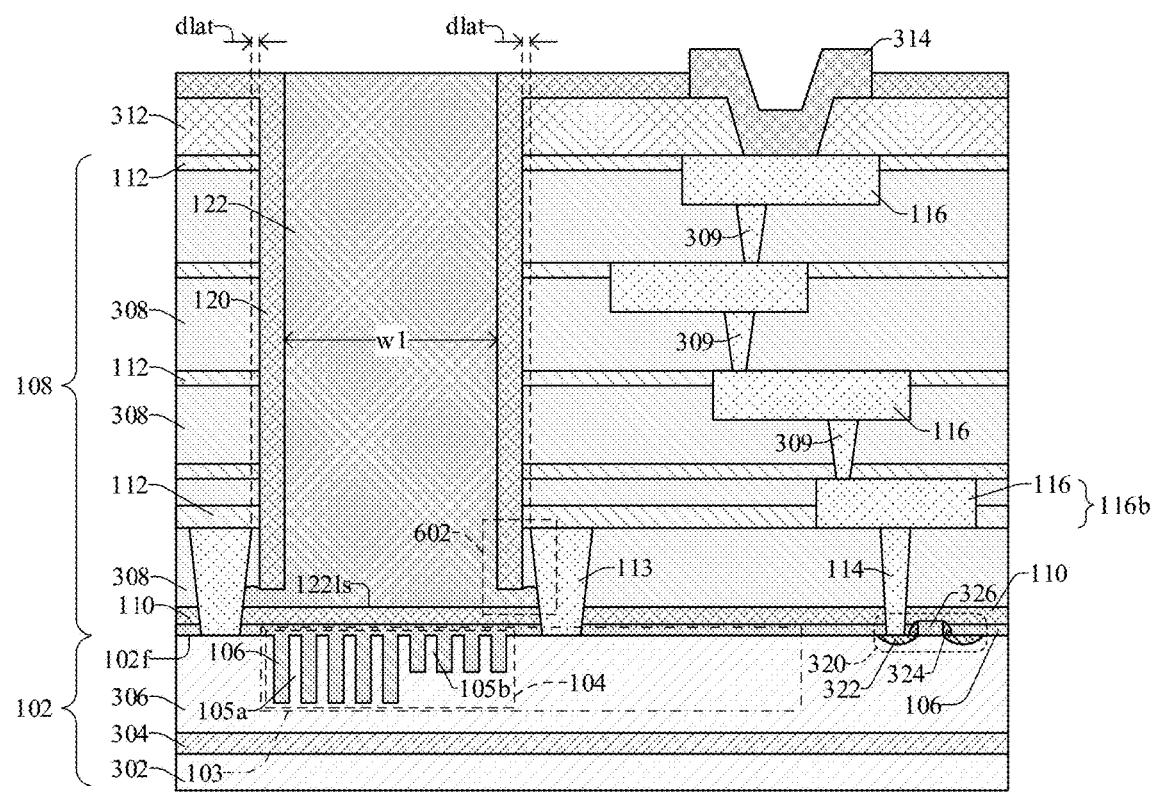
FIG. 6A illustrates a cross-sectional view of an integrated chip according to some alternative embodiments of the integrated chip of FIG. 1.

FIG. 6A illustrates a cross-sectional view of some embodiments of an integrated chip 600a according to some alternative embodiments of the integrated chip 300 of FIG. 3.

In some embodiments, the upper etch stop layer 120 is laterally offset from a sidewall of the protective ring structure 113 by a lateral distance dlat. In such embodiments, at least a portion of a lower ILD layer 308 is disposed between the upper etch stop layer 120 and the protective ring structure 113. In some embodiments, a width w1 of the light pipe structure 122 is about 100 micrometers or within a range of about 95 to 105 micrometers. It will be appreciated that other values for the width w1 are within the scope of the disclosure.

Figure 6B:
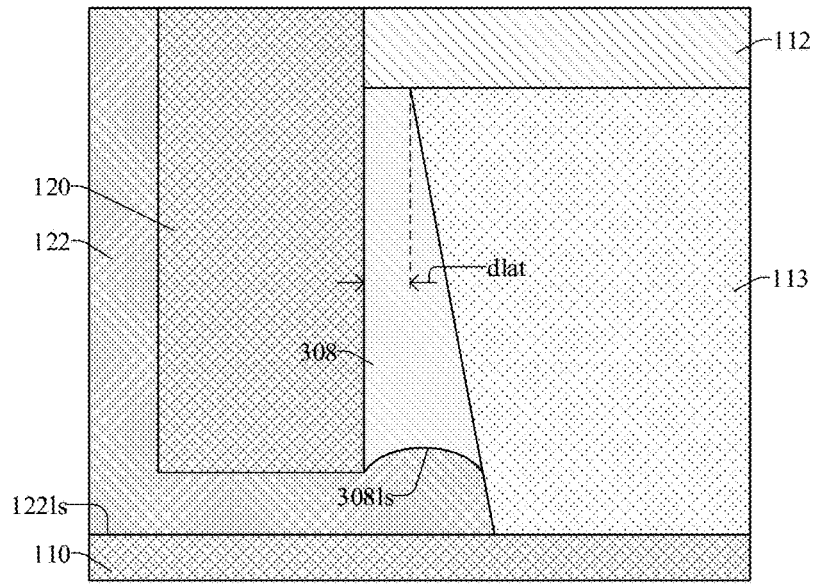
FIG. 6B illustrates a cross-sectional view of some embodiments of a close-up view of a section of the integrated chip of FIG. 6A.

FIG. 6B illustrates a cross-sectional view 604 of some embodiments of a close-up view of a section of the integrated chip 600a of FIG. 6A according to the box 602.

In some embodiments, due to a wet etch process utilized during formation of the integrated chip 600a, an ILD layer 308 disposed between the upper etch stop layer 120 and the protective ring structure 113 comprises a curved lower surface 308ls. In such embodiments, the light pipe structure 122 comprises a lower protrusion that extends along the curved lower surface 308ls of the ILD layer 308.

Figure 7:
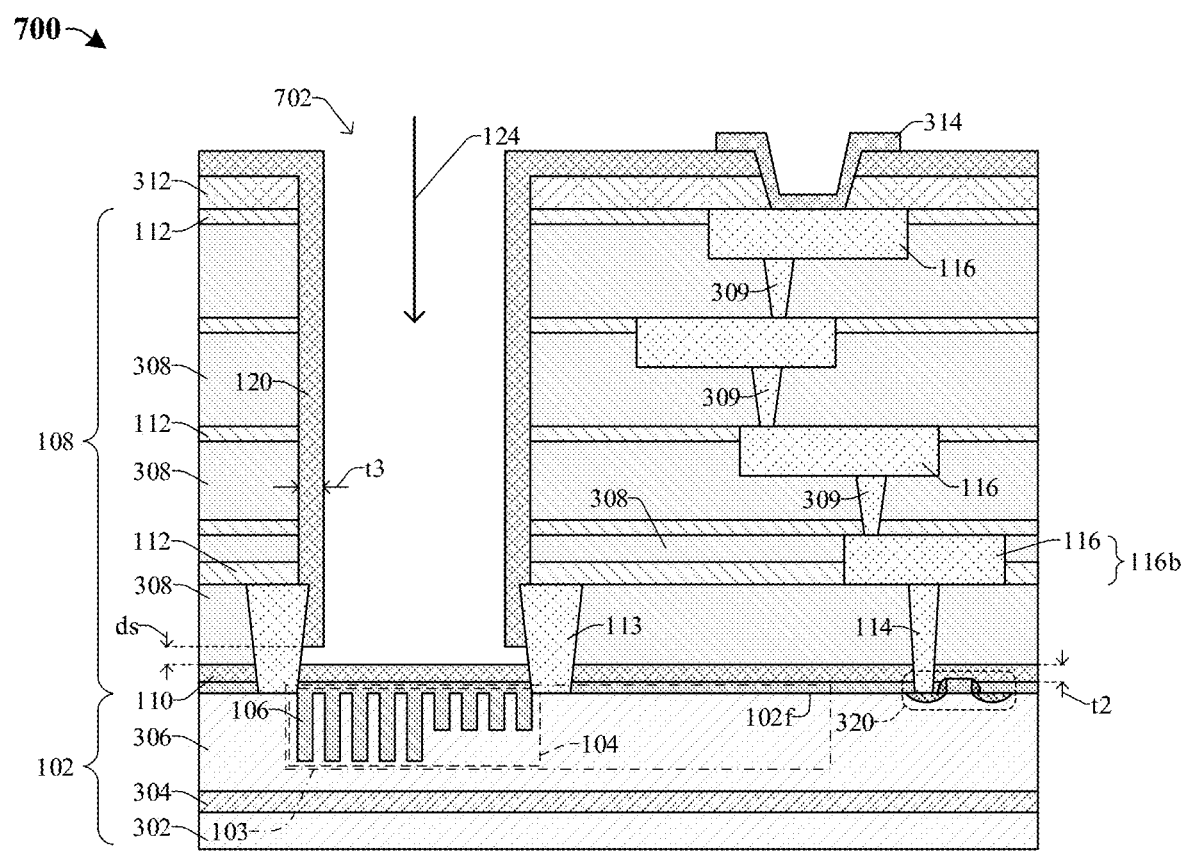
FIG. 7 illustrates a cross-sectional view of an integrated chip according to some alternative embodiments of the integrated chip of FIG. 1.

FIG. 7 illustrates a cross-sectional view of some embodiments of an integrated chip 700 according to some alternative embodiments of the integrated chip 100 of FIG. 1, in which the light pipe structure (122 of FIG. 1) comprises air or is omitted. Thus, a light pipe opening 702 extends from an upper surface of the upper etch stop layer 120 to an upper surface of the CESL 110 overlying the grating coupler structure 104.

In some embodiments, light 124 may, for example, be transmitted by an optical transmitter (not shown). The optical transmitter may be connected to an optical fiber cable (not shown) (e.g., single-mode fiber), such that the optical transmitter is configured to transfer the light 124 from the optical fiber cable to the waveguide structure 103. Thus, the light 124 may travel through the light pipe opening 702 (i.e., air) before reaching the CESL 110. In some embodiments, the light 124 disposed upon the grating coupler structure 104 comprises wavelengths within the visible light spectrum (e.g., between approximately 850 nm and approximately 1650 nm). It will be appreciated that other values for the wavelengths are within the scope of the disclosure. In some embodiments, if the second thickness t2 of the CESL 110 is about 125 Angstroms and the first thickness t1 of the dielectric waveguide layer 106 is about 800 Angstroms, then an absorption of the grating coupler structure 104 is increased. In such embodiments, an absorption coefficient of the light pipe opening 702 (e.g., comprising air), the CESL 110 (e.g., comprising silicon nitride ($Si_3N_4$)), the dielectric waveguide layer 106 (e.g., comprising silicon oxide ($SiO_2$)), and the device layer 306 (e.g., comprising silicon) is within a range of about 0.8 to 0.9 when the light 124 comprises wavelengths within the visible light spectrum. This is because the CESL 110 has a first refractive index (e.g., about 2) and the dielectric waveguide layer 106 has a second refractive index (e.g., about 1.45) less than the first refractive index. By virtue of the first refractive index being greater than the second refractive index, the light 124 is guided to the grating coupler structure 104. This in turn increases an amount of incident light 124 disposed upon the grating coupler structure 104, thereby increasing the QE of the waveguide structure 103. In further embodiments, if the CESL 110 is omitted (not shown), then an absorption coefficient of the dielectric waveguide layer 106 and the device layer 306 is less than 0.7. In such embodiments, this decreases an amount of light 124 disposed upon the grating coupler structure 104, thereby decreasing a QE of the waveguide structure 103. In yet further embodiments, if a portion of the ILD layer 308 overlies the grating coupler structure 104, then an absorption coefficient of the ILD layer 308, CESL 110, dielectric waveguide layer 106, and device layer 306 is less than 0.8. In such embodiments, this decreases an amount of light 124 disposed upon the grating coupler structure 104, thereby decreasing a QE of the waveguide structure 103.

In some embodiments, the second thickness t2 of the CESL 110 is within a range of about 125 to 1,000 Angstroms. It will be appreciated that other values for the second thickness t2 are within the scope of the disclosure. In further embodiments, the upper etch stop layer 120 has a third thickness t3 that is within a range of about 500 to 1,000 Angstroms. It will be appreciated that other values for the third thickness t3 are within the scope of the disclosure. In some embodiments, if the second thickness t2 is less than 125 Angstroms and/or the third thickness t3 is less than about 500 Angstroms, then the CESL 110 and/or the upper etch stop layer 120 may not be thick enough to protect the ILD layers 308, the semiconductor substrate 102, and/or the passivation structure 312 from corrosive chemicals (e.g., water) and/or corrosive materials. This in turn may result in damage (e.g., delamination) to layers within the interconnect structure 108. In further embodiments, if the second and/or third thicknesses t2, t3 are greater than about 1,000 Angstroms, then costs associated with forming the integrated chip 700 may be increased.

In yet further embodiments, a distance ds between a bottom surface of the upper etch stop layer 120 and the upper surface of the CESL 110 is within a range of about 500 to 5,000 Angstroms. It will be appreciated that other values for the distance ds are within the scope of the disclosure. In some embodiments, if the distance ds is less than 500 Angstroms, then a dry etch process used to form the light pipe opening 702 may damage the grating coupler structure 104. For example, the dry etch process may be performed by a plasma etch with a high power and hence a high electric field strength, such that electrons may accumulate in the device layer 306 and/or the dielectric waveguide layer 106. This in turn may reduce a QE of the grating coupler structure 104. In yet further embodiments, if the distance ds is greater than 5,000 Angstroms, then a wet etch used to expand the light pipe opening 702 and/or remove the ILD layer 308 from the CESL 110 overlying the grating coupler structure 104 may damage dielectric layer(s) above the protective ring structure 113. For example, in such embodiments, a lower surface of the upper etch stop layer 120 may be disposed above an upper surface of the protective ring structure 113. Thus, the upper etch stop layer 120 may not extend along sidewalls of ILD layer(s) 308 disposed above the protective ring structure 113. This in turn may reduce a structural integrity of the layers within the interconnect structure 108.

FIGS. 8-16 illustrate cross-sectional views 800-1600 of some embodiments of a method for forming an integrated chip comprising a waveguide structure and a protective ring structure overlying the waveguide structure according to aspects of the present disclosure. Although the cross-sectional views 800-1600 shown in FIGS. 8-16 are described with reference to a method, it will be appreciated that the structures shown in FIGS. 8-16 are not limited to the method but rather may stand alone separate of the method. Although FIGS. 8-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 8:
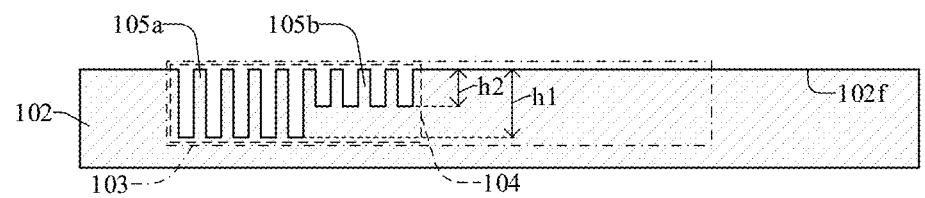
FIGS. 8-16 illustrate a series of cross-sectional views of some embodiments of a method for forming an integrated chip comprising a waveguide structure and a protective ring structure overlying the waveguide structure.

As shown in cross-sectional view 800 of FIG. 8, a semiconductor substrate 102 is provided and a waveguide structure 103 is formed on a front-side 102f of the semiconductor substrate 102. In some embodiments, the semiconductor substrate 102 may be, for example, a bulk substrate (e.g., a bulk silicon substrate), a silicon-on-insulator (SOI) substrate, or some other suitable substrate. In further embodiments, forming the waveguide structure 103 may include: forming a masking layer (not shown) over the front-side 102f; patterning the semiconductor substrate 102 according to the masking layer, thereby defining the waveguide structure 103; and performing a removal process to remove the masking layer. In further embodiments, patterning the semiconductor substrate 102 may include performing one or more etching processes according to one or more masking layers (not shown). The patterning process may, for example, forming a first set of grating segments 105a with a first height h1 and a second set of grating segments 105b with a second height h2 different from the first height h1, thereby forming a grating coupler structure 104.

Figure 9:
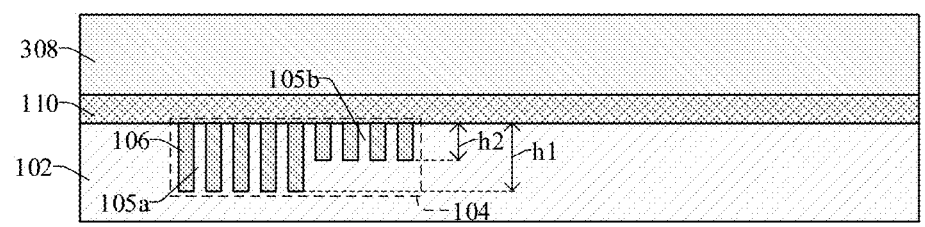

As shown in cross-sectional view 900 of FIG. 9, a dielectric waveguide layer 106 is formed over the semiconductor substrate 102 and is laterally spaced between the first and second set of grating segments 105a, 105b. In some embodiments, the dielectric waveguide layer 106 may, for example, be or comprise silicon dioxide, another dielectric material, or any combination of the foregoing. A contact etch stop layer (CESL) 110 is formed over the semiconductor substrate 102 and the dielectric waveguide layer 106. In some embodiments, the CESL 110 may, for example, be or comprise silicon nitride, silicon carbide, silicon oxy-nitride, another suitable dielectric material, or any combination of the foregoing. An inter-level dielectric (ILD) layer 308 is formed over the CESL 110. In some embodiments, the ILD layer 308 may, for example, be or comprise silicon dioxide, a low-k dielectric material, an extreme low-k dielectric material, another suitable dielectric material, or any combination of the foregoing. In some embodiments, the dielectric waveguide layer 106, the CESL 110, and/or the ILD layer 308 may, for example, respectively be formed by chemical vapor deposition (CVD), physical vapor deposition (PVD), atomic layer deposition (ALD), or another suitable growth or deposition process.

Figure 10:
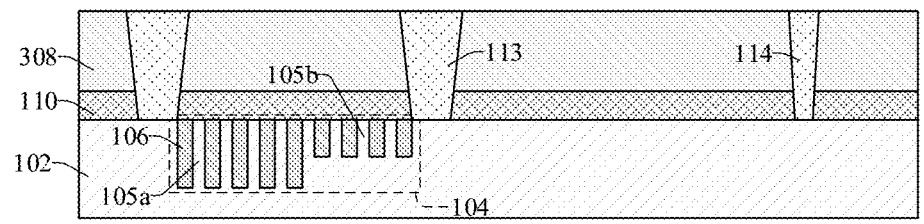

As shown in cross-sectional view 1000 of FIG. 10, one or more conductive contacts 114 and a protective ring structure 113 are formed over the semiconductor substrate 102. In some embodiments, the one or more conductive contacts 114 and/or the protective ring structure 113 may be formed by a single damascene process. In further embodiments, a process for forming the one or more conductive contacts 114 and/or the protective ring structure 113 may include: forming a masking layer (not shown) over the ILD layer 308; etching the ILD layer 308 and the CESL 110 according to the masking layer, thereby forming openings that correspond to the one or more conductive contacts 114 and/or the protective ring structure 113; filling the openings with a conductive material (e.g., aluminum, copper, tungsten, tantalum, a combination of the foregoing, or the like), thereby defining the one or more conductive contacts 114 and/or the protective ring structure 113. In yet further embodiments, the aforementioned process may include performing a planarization process into the conductive material until an upper surface of the ILD layer 308 is reached. In some embodiments, the conductive material may be deposited by, for example, CVD, PVD, electroless plating, sputtering, or another growth or deposition process.

Figure 11:
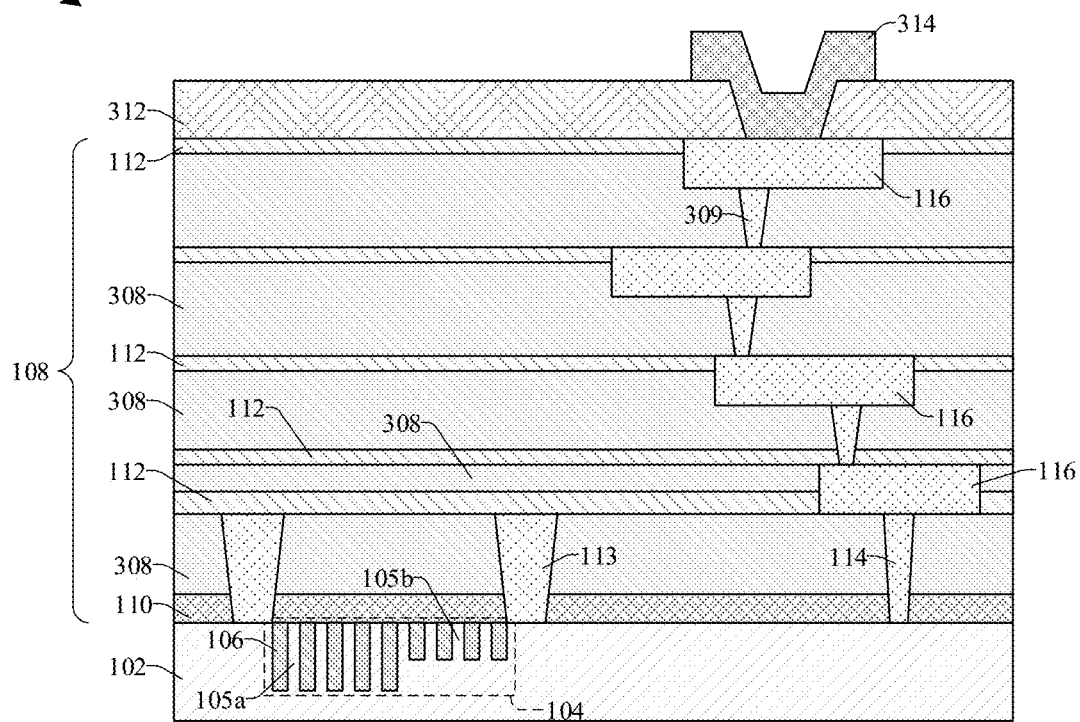

As shown in cross-sectional view 1100 of FIG. 11, a plurality of ILD layers 308, a plurality of conductive vias 309, a plurality of conductive wires 116, and a plurality of conductor protection layers 112 are formed over the semiconductor substrate 102, thereby defining an interconnect structure 108. The conductive vias 309 and/or the conductive wires 116 may, for example, be formed by a single damascene process, a dual damascene process, or another suitable process. Further, the ILD layers 308 and/or the conductor protection layers 112 may, for example, be formed by CVD, PVD, ALD, or another suitable deposition or growth process. Furthermore, a passivation structure 312 and a bond pad structure 314 are formed over the interconnect structure 108.

Figure 12:
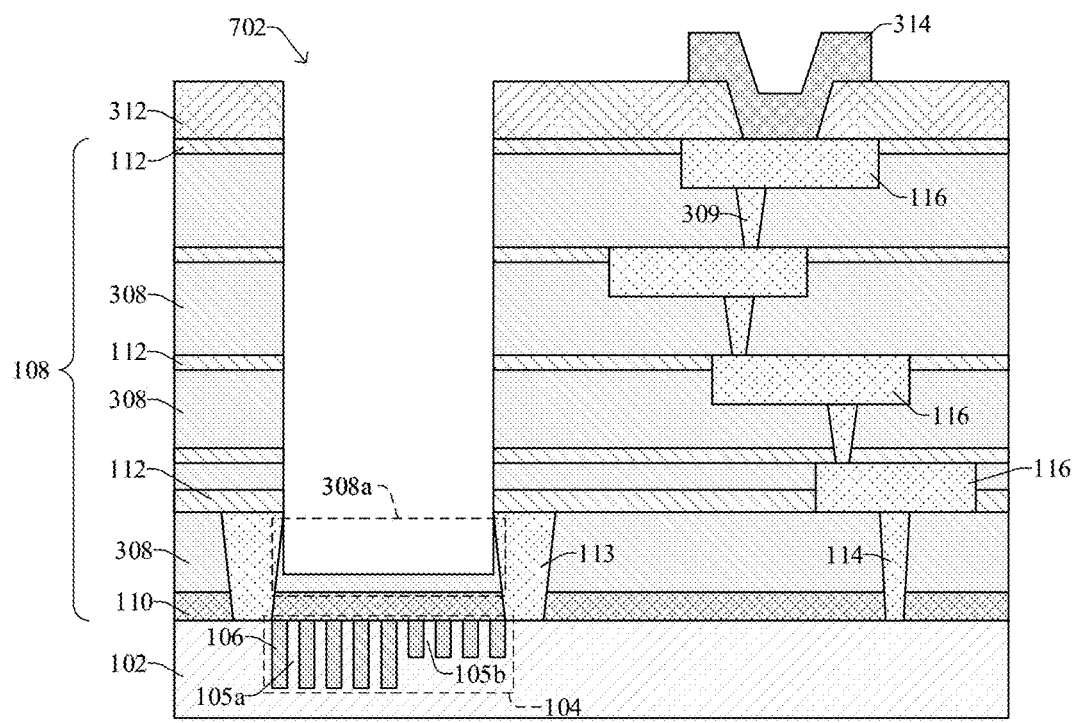

As shown in cross-sectional view 1200 of FIG. 12, an etching process is performed to define a light pipe opening 702 in the interconnect structure 108 and the passivation structure 312. In some embodiments, the etching process includes forming a masking layer (not shown) over the passivation structure 312, exposing layers within the interconnect structure 108 and the passivation structure 312 to one or more etchants, and subsequently removing the masking layer (not shown). In some embodiments, the etching process may be a high power dry etch process, such as a plasma etch. In further embodiments, the high power dry etch process may have a high power range of about 1,000 to 4,000 Watts. It will be appreciated that other values for the power range of the high power dry etch process are within the scope of the disclosure. In further embodiments, a segment 308a of an ILD layer 308 remains over an upper surface of the CESL 110 after performing the etching process. In yet further embodiments, the etching process exposes a sidewall and/or an upper surface of the protective ring structure 113 (not shown).

Figure 13:
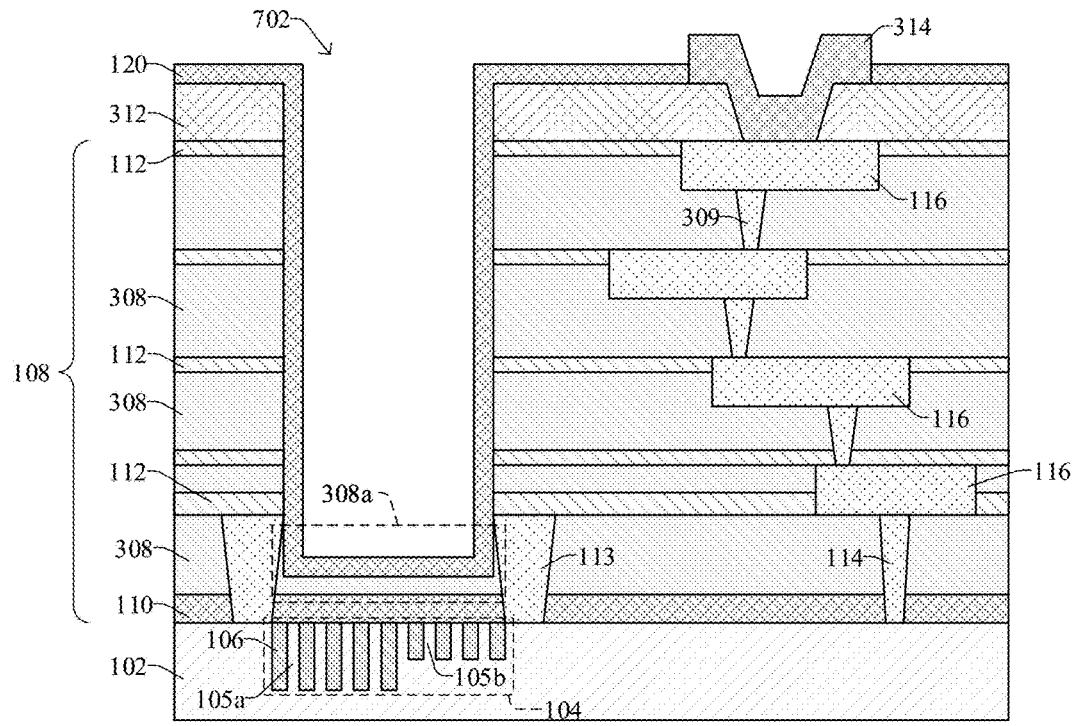

As shown in cross-sectional view 1300 of FIG. 13, an upper etch stop layer 120 is formed over an upper surface of the passivation structure 312 and over the segment 308a of the ILD layer 308 that overlies the CESL 110. In some embodiments, the upper etch stop layer 120 lines the light pipe opening 702 and continuously extends along sidewalls of the passivation structure 312, sidewalls of the ILD layers 308, and sidewalls of the conductor protection layer 112. In further embodiments, the upper etch stop layer 120 may, for example, be or comprise silicon nitride, silicon carbide, silicon oxy-nitride, another suitable dielectric material, or any combination of the foregoing. Thus, the upper etch stop layer 120 may be configured to mitigate damage to the sidewalls of the passivation structure 312, sidewalls of the ILD layers 308, and sidewalls of the conductor protection layer 112 during subsequent processing steps (e.g., the etching process of FIG. 14 and/or the etching process of FIG. 15A). In some embodiments, the upper etch stop layer 120 may, for example, be deposited by CVD, PVD, ALD, or another suitable deposition or growth process.

Figure 14:
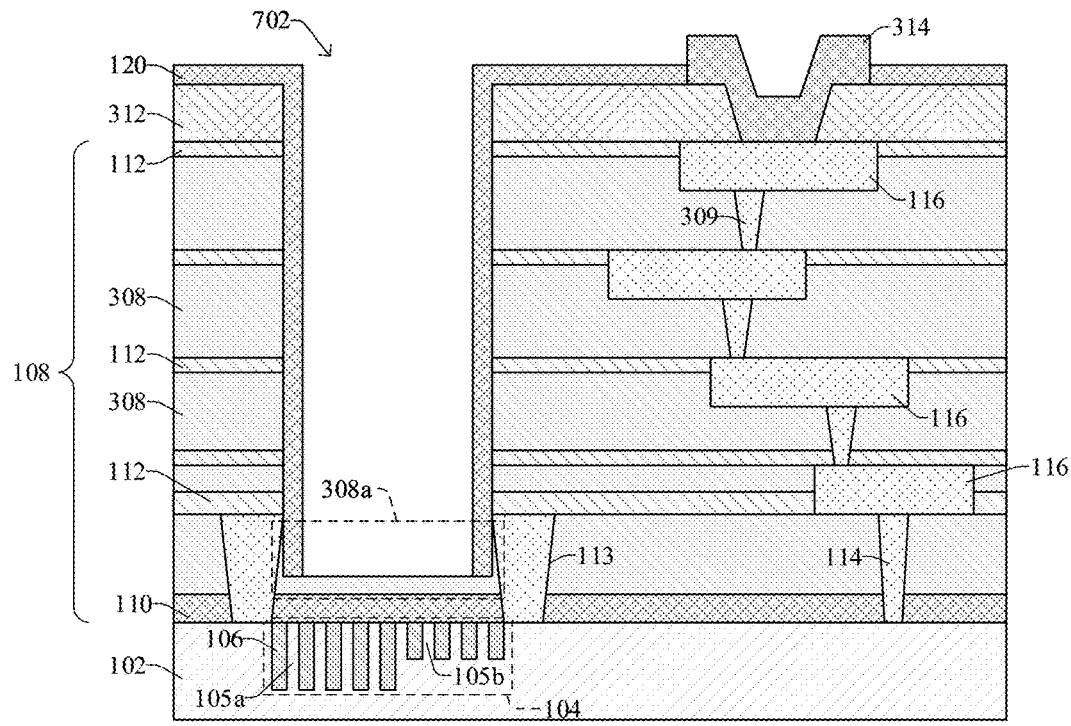

As shown in cross-sectional view 1400 of FIG. 14, an etching process is performed to remove a lower segment of the upper etch stop layer 120 and to expose the segment 308a of the ILD layer 308 that overlies the CESL 110. In some embodiments, the etching process comprises an etch back and hence does not reply upon a masking layer. The etching process exposes an upper surface of the segment 308a of the ILD layer 308 that overlies the CESL 110. In some embodiments, the etching process utilized to remove the lower segment of the upper etch stop layer 120 may, for example, be a low power dry etch process (e.g., a plasma etch process with an etch power less than the high power dry etch process of FIG. 12). The use of the low power dry etch process may, for example, mitigate an accumulation of electrons on the semiconductor substrate 102 and/or the dielectric waveguide layer 106.

Figure 15A:
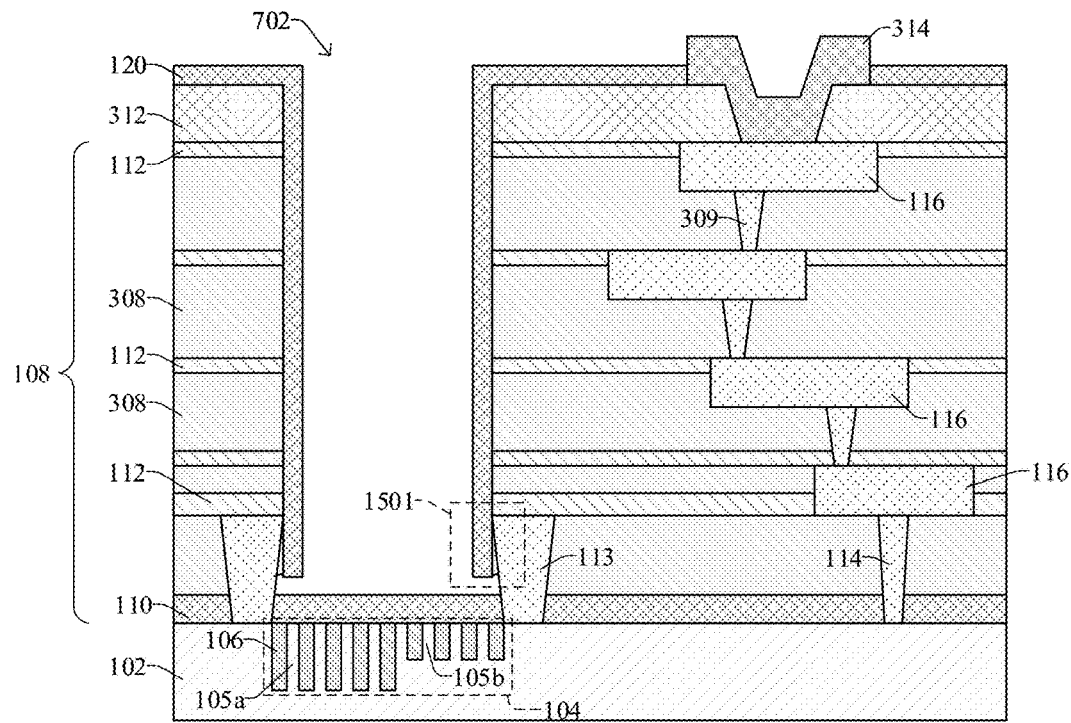

As shown in cross-sectional view 1500 of FIG. 15A, an etching process is performed to remove the segment (308a of FIG. 14) of the ILD layer 308, thereby expanding the light pipe opening 702 and exposing an upper surface of the CESL 110 overlying the grating coupler structure 104. In some embodiments, the etching process is a wet etch process. Further, the wet etch process may, for example utilize one or more etchants (e.g., hydrogen fluoride). In some embodiments, the wet etch process completely removes the segment (308a of FIG. 14) of the ILD layer 308 overlying the grating coupler structure 104. The etching process laterally removes the segment (308a of FIG. 14) of the ILD layer 308 until a sidewall of the protective ring structure 113 is exposed. Thus, the wet etch process is able to expand the light pipe opening 702 while avoiding damage that may occur during a dry etching process. This in turn further mitigates an accumulation of electrons on the semiconductor substrate 102 and/or prevents damage to the grating coupler structure 104.

Figure 15B:
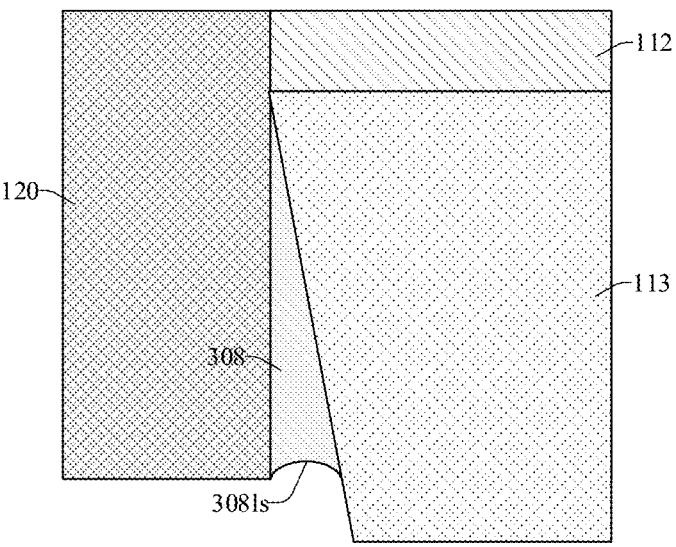

FIG. 15B illustrates a cross-sectional view 1502 according to some embodiments of a section (e.g., the dashed box 1501 of FIG. 15A) of the structure of FIG. 15A. In some embodiments, the ILD layer 308 may remain between the protective ring structure 113 and the upper etch stop layer 120. In such embodiments, due to the wet etch process, the ILD layer 308 may have a curved lower surface 3081s. In yet further embodiments, the wet etch process may completely remove the ILD layer 308 spaced laterally between the protective ring structure 113 and the upper etch stop layer 120 (not shown).

Figure 16:
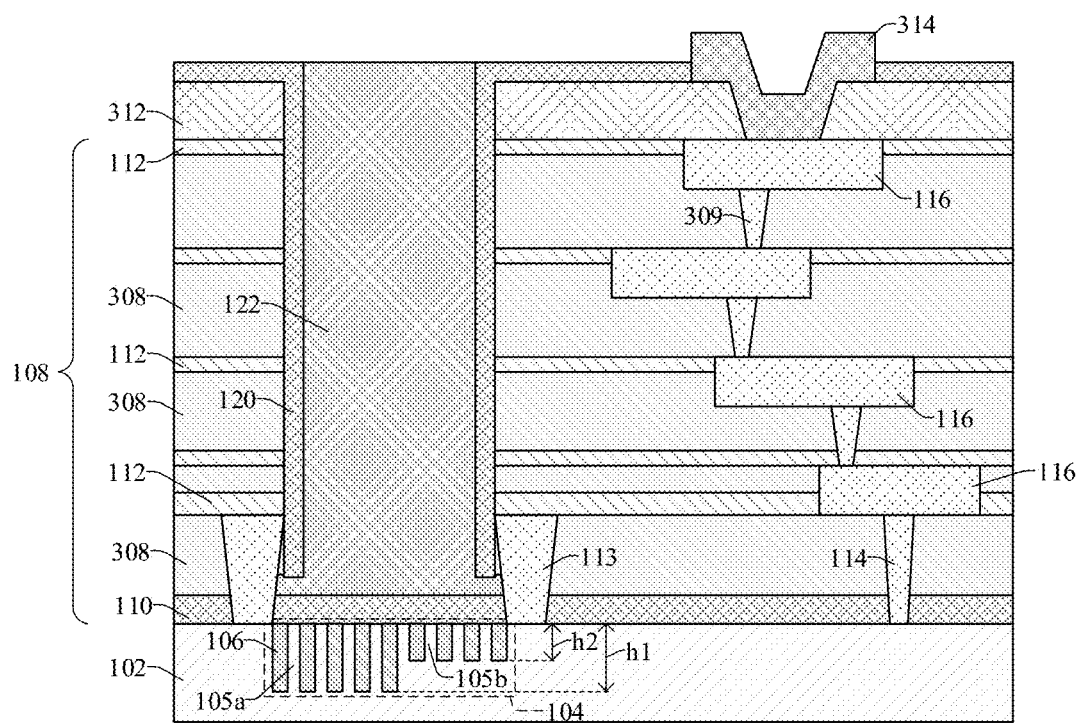

As shown in cross-sectional view 1600 of FIG. 16, a light pipe structure 122 is formed within the light pipe opening (702 of FIG. 15A). In some embodiments, the light pipe structure 122 may, for example, be deposited by CVD, PVD, ALD, or another suitable deposition or growth process. In further embodiments, the light pipe structure 122 is not formed, such that the light pipe opening (702 of FIG. 15A) remains unfilled over the grating coupler structure 104 (not shown) (e.g., see FIG. 7).

Figure 17:
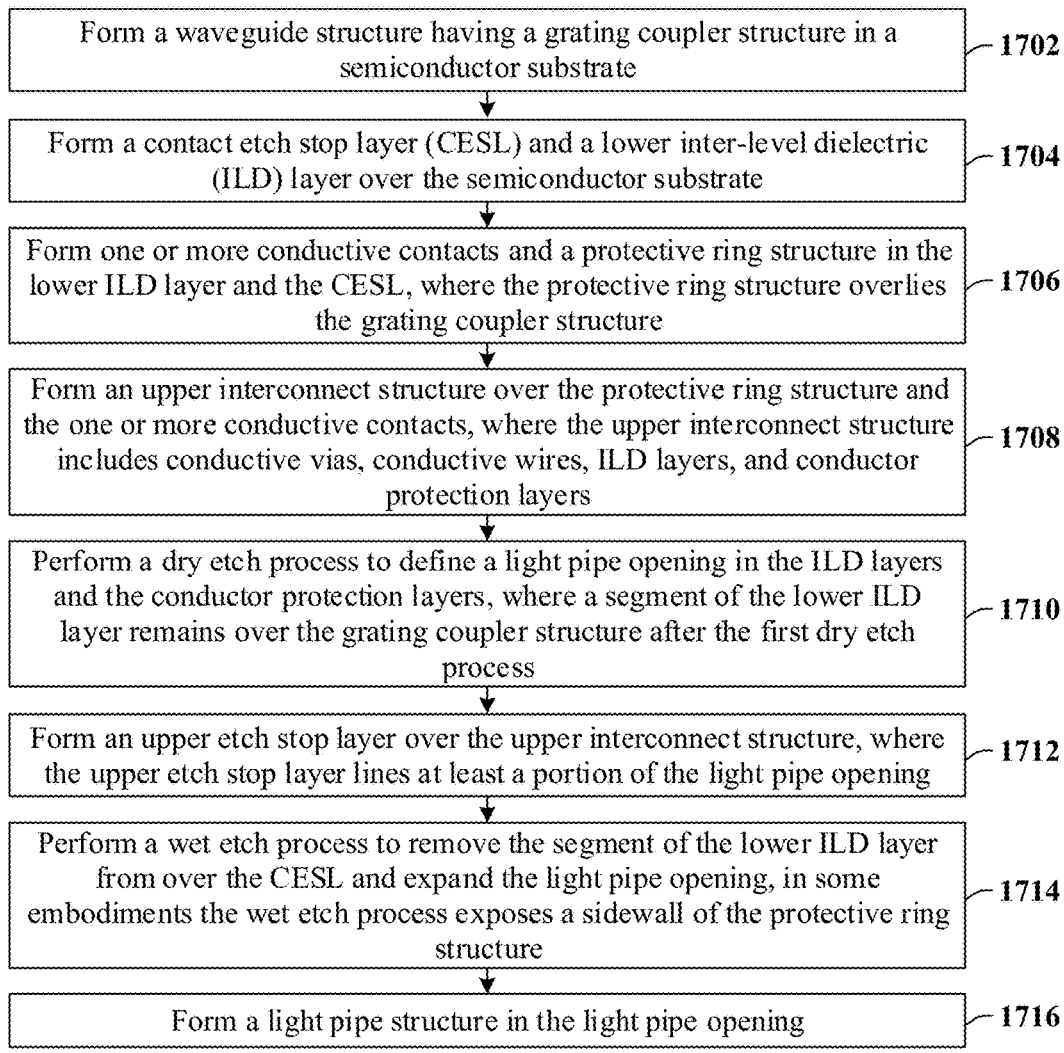
FIG. 17 illustrates a block diagram of some embodiments of the method of FIGS. 8-16.

FIG. 17 illustrates a method 1700 of forming an integrated chip comprising a waveguide structure and a protective ring structure overlying the waveguide structure according to the present disclosure. Although the method 1700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1702, a waveguide structure having a grating coupler structure is formed in a semiconductor substrate. FIG. 8 illustrates a cross-sectional view 800 corresponding to some embodiments of act 1702, At act 1704, a contact etch stop layer (CESL) and a lower inter-level dielectric (ILD) layer are formed over the semiconductor substrate. FIG. 9 illustrates a cross-sectional view 900 corresponding to some embodiments of act 1704.

At act 1706, one or more conductive contacts and a protective ring structure are formed in the lower ILD layer and the CESL. The protective ring structure overlies the grating coupler structure. FIG. 10 illustrates a cross-sectional view 1000 corresponding to some embodiments of act 1706.

At act 1708, an upper interconnect structure is formed over the protective ring structure and the one or more conductive contacts, where the upper interconnect structure includes conductive vias, conductive wires, ILD layers, and conductor protection layers. FIG. 11 illustrates a cross-sectional view 1100 corresponding to some embodiments of act 1708.

At act 1710, a dry etch process is performed to define a light pipe opening in the ILD layers and the conductor protection layers, where a segment of the lower ILD layer remains over the grating coupler structure after the first dry etch process. FIG. 12 illustrates a cross-sectional view 1200 corresponding to some embodiments of act 1710.

At act 1712, an upper etch stop layer is formed over the upper interconnect structure. The upper etch stop layer lines at least a portion of the light pipe opening. FIGS. 13 and 14 illustrate cross-sectional views 1300 and 1400 corresponding to some embodiments of act 1712.

At act 1714, a wet etch process is performed to remove the segment of the lower ILD layer from over the CESL and expand the light pipe opening. In some embodiments, the wet etch process exposes a sidewall of the protective ring structure. FIG. 15A illustrates a cross-sectional view 1500 corresponding to some embodiments of act 1714.

At act 1716, a light pipe structure is formed in the light pipe opening. FIG. 16 illustrates a cross-sectional view 1600 corresponding to some embodiments of act 1716.

Accordingly, in some embodiments, the present application provides an integrated chip that includes a waveguide structure having a grating coupler structure, where a protective ring structure overlies the grating coupler structure. An interconnect structure overlies the waveguide structure and, in some embodiments, a light pipe structure extends from an upper surface of the interconnect structure to a sidewall of the protective ring structure.

In some embodiments, the present application provides an integrated chip including a semiconductor substrate; a waveguide structure disposed within the semiconductor substrate, wherein the waveguide structure includes a grating coupler structure; an interconnect structure overlying the semiconductor substrate, wherein the interconnect structure includes a contact etch stop layer (CESL) and a conductive contact over the semiconductor substrate, wherein the conductive contact extends through the CESL; and a protective ring structure overlying the grating coupler structure, wherein the protective ring structure extends through the CESL and has an upper surface aligned with an upper surface of the conductive contact.

In some embodiments, the present application provides an integrated chip including a semiconductor substrate; a grating coupler structure disposed on a front-side of the semiconductor substrate, wherein the grating coupler structure includes a plurality of grating segments laterally separated from one another; an interconnect structure overlying the front-side of the semiconductor substrate and including a contact etch stop layer (CESL), a plurality of conductive wires, conductive vias, and a plurality of inter-level dielectric (ILD) layers; a waveguide dielectric layer disposed between the CESL and the front-side of the semiconductor substrate, wherein the waveguide dielectric layer is disposed between adjacent grating segments; an upper etch stop layer overlying the interconnect structure and continuously extending along sidewalls of the ILD layers to below a bottommost conductive wire of the plurality of conductive wires; and a protective ring structure overlying the grating coupler structure, wherein the grating segments are spaced laterally between a perimeter of the protective ring structure.

In some embodiments, the present application provides a method for forming an integrated chip, the method including forming a grating coupler structure in a front-side of a semiconductor substrate; forming a protective ring structure over the grating coupler structure; forming an interconnect structure over the front-side of the semiconductor substrate, wherein the interconnect structure includes a plurality of inter-level dielectric (ILD) layers, a plurality of conductive wires, and a plurality of conductive vias; performing a first dry etch process on the interconnect structure to define a light pipe opening in the plurality of ILD layers, such that a segment of a lower ILD layer remains over the grating coupler structure after the first dry etch process and the light pipe opening is spaced laterally within a perimeter of the protective ring structure; forming an upper etch stop layer over an upper surface of the interconnect structure and lining the light pipe opening, such that a lower surface of the upper etch stop layer is disposed along the segment of the lower ILD layer; and performing a wet etch process on the lower ILD layer, such that the segment of the lower ILD layer is removed, thereby exposing a sidewall of the protective ring structure and expanding the light pipe opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
an optical device disposed on a substrate;
a dielectric structure over the substrate, wherein the dielectric structure comprises one or more sidewalls defining a light channel over a region of the optical device;
a first dielectric layer on the dielectric structure; and
a protective structure above the optical device and disposed on opposing sides of the light channel, wherein the first dielectric layer overlies the protective structure and contacts an inner sidewall of the protective structure.

2. The integrated chip of claim 1, further comprising:
a lower etch stop layer disposed on the substrate over the optical device, wherein the protective structure extends through the lower etch stop layer.

3. The integrated chip of claim 2, wherein the dielectric structure comprises a second dielectric layer disposed along outer sidewalls of the protective structure, wherein the second dielectric layer comprises a dielectric material different from that of the lower etch stop layer.

4. The integrated chip of claim 1, wherein the first dielectric layer extends along the one or more sidewalls of the dielectric structure, wherein a bottom surface of the first dielectric layer is below an upper surface of the protective structure.

5. The integrated chip of claim 1, wherein a first distance between a bottom surface of the first dielectric layer and the substrate is less than a second distance between an upper surface of the protective structure and the bottom surface of the first dielectric layer.

6. The integrated chip of claim 1, further comprising:
a conductive interconnect element disposed in the dielectric structure, wherein an upper surface of the protective structure is aligned with an upper surface of the conductive interconnect element.

7. The integrated chip of claim 6, wherein a width of a first segment of the protective structure is greater than a width of the conductive interconnect element.

8. The integrated chip of claim 1, wherein when viewed from above the protective structure has a first shape and when viewed in cross section the protective structure has a second shape different from the first shape.

9. An integrated chip, comprising:
an interconnect structure overlying a first surface of a substrate, wherein the interconnect structure comprises a first conductive interconnect element disposed within a dielectric structure;
an optical channel region defined by opposing sidewalls of the dielectric structure, wherein the opposing sidewalls of the dielectric structure extend from an upper surface of the dielectric structure to below an upper surface of the first conductive interconnect element; and
a conductive structure disposed in the interconnect structure above the substrate, wherein the conductive structure laterally wraps around a lower segment of the opposing sidewalls of the dielectric structure.

10. The integrated chip of claim 9, wherein a lower surface of the conductive structure is aligned with a lower surface of the first conductive interconnect element.

11. The integrated chip of claim 9, wherein the conductive structure directly overlies an optical input region of the substrate.

12. The integrated chip of claim 9, further comprising:
a first etch stop layer disposed on the substrate, wherein the first etch stop layer is disposed around an inner and outer perimeter of the conductive structure.

13. The integrated chip of claim 12, further comprising:
a second etch stop layer disposed along inner sidewalls of the conductive structure, wherein the second etch stop layer has a height greater than that of the first etch stop layer.

14. The integrated chip of claim 9, wherein the interconnect structure further comprises a protective dielectric layer extending from an upper surface of the conductive structure to a sidewall of a second conductive interconnect element.

15. The integrated chip of claim 9, wherein a height of the conductive structure is equal to a height of the first conductive interconnect element.

16. A method for forming an integrated chip, the method comprising:
forming a first dielectric structure over a substrate;
forming a conductive structure within the first dielectric structure;
forming a second dielectric structure over the conductive structure;
performing a first etch on the second dielectric structure to form a light channel opening in the second dielectric structure spaced between sidewalls of the conductive structure; and
forming an upper etch stop layer lining the light channel opening and having a lower surface disposed below an upper surface of the conductive structure.

17. The method of claim 16, further comprising:
performing a second etch on the first dielectric structure to expand the light channel opening.

18. The method of claim 16, wherein the upper etch stop layer contacts the sidewalls of the conductive structure.

19. The method of claim 16, wherein the conductive structure continuously laterally extends around the light channel opening.

20. The method of claim 16, wherein the first dielectric structure comprises a lower etch stop layer, wherein a height of the upper etch stop layer is greater than a height of the lower etch stop layer.

* * * * *